(12) United States Patent
Hessenius et al.

(10) Patent No.: US 12,055,604 B1
(45) Date of Patent: Aug. 6, 2024

(54) STABILIZATION OF LASER-BASED SENSORS

(71) Applicant: DeUVe Photonics, Inc., Tucson, AZ (US)

(72) Inventors: Chris Hessenius, Tucson, AZ (US); Mahmoud Fallahi, Tucson, AZ (US)

(73) Assignee: DEUVE PHOTONICS, INC., Tucson, AZ (US)

( * ) Notice: Subject to any disclaimer, the term of this patent is extended or adjusted under 35 U.S.C. 154(b) by 0 days.

(21) Appl. No.: 18/501,713

(22) Filed: Nov. 3, 2023

Related U.S. Application Data (60) Provisional application No. 63/512,043, filed on Jul. 5, 2023.

(51) Int. Cl.
  *G01R 33/032* (2006.01)
(52) U.S. Cl.
  CPC .................................. *G01R 33/032* (2013.01)
(58) Field of Classification Search
  CPC .................................................... G01R 33/032
  USPC ......................................................... 324/244.1
  See application file for complete search history.

(56) References Cited

U.S. PATENT DOCUMENTS

| | | | | |
|---|---|---|---|---|
| 5,119,024 A * | 6/1992 | Popovic | ............... | G01R 33/032 356/519 |
| 7,723,985 B2 * | 5/2010 | Smith | ................... | G01R 33/032 324/300 |
| 8,422,119 B1 | 4/2013 | Keaton et al. | | |
| 9,568,565 B2 * | 2/2017 | Parsa | .................... | G01R 33/032 |
| 9,684,041 B2 * | 6/2017 | Nagasaka | ............... | G01R 33/26 |
| 2004/0252734 A1 | 12/2004 | Karpushko | | |
| 2011/0175604 A1 * | 7/2011 | Polzer | .................. | G01R 33/022 324/246 |
| 2013/0021602 A1 | 1/2013 | Dribinski et al. | | |
| 2015/0071316 A1 | 3/2015 | Chuang | | |

(Continued)

FOREIGN PATENT DOCUMENTS

WO   2004064211 A1   7/2004

OTHER PUBLICATIONS

Shin, David. Nonlocal correlations between freely propagating pairs of atoms. Diss. The Australian National University (Australia), 2022. (Year: 2022).*

(Continued)

*Primary Examiner* — Christopher P McAndrew
(74) *Attorney, Agent, or Firm* — NGUYEN TARBET IP LAW (57) ABSTRACT

A magnetometer system structured to measure a magnetic field. The device may comprise a housing with shock absorbers disposed within and a laser cavity network disposed within the housing. The laser cavity network may comprise one or more laser cavity arms, each having a gain chip configured to generate a laser beam and a means for locking a wavelength of the laser beam. The laser cavity network may further comprise a nitrogen-vacancy (NV) diamond disposed within the laser cavity network, configured to accept the one or more laser beams of the one or more laser cavity arms and measure the magnetic field in response to the plurality of laser beams. The system may further comprise a supply and control subsystem communicatively connected to the laser cavity network such that the supply and control subsystem is external to the housing, comprising a laser pumping source.

3 Claims, 3 Drawing Sheets

(56) References Cited

U.S. PATENT DOCUMENTS

| | | |
|---|---|---|
| 2015/0311673 A1 | 10/2015 | Wang et al. |
| 2017/0212177 A1* | 7/2017 | Coar .................... G01H 1/00 |
| 2017/0212180 A1* | 7/2017 | Hahn ................ G01R 33/032 |
| 2017/0212186 A1* | 7/2017 | Hahn ................. G01J 1/0425 |
| 2018/0337516 A1 | 11/2018 | Tatum et al. |

OTHER PUBLICATIONS

Steinert, Steffen, et al. "High sensitivity magnetic imaging using an array of spins in diamond." Review of scientific instruments 81.4 (2010). (Year: 2010).*

Hannegan II, John Michael. Experiments with Frequency Converted Photons from a Trapped Atomic Ion. Diss. University of Maryland, College Park, 2022. (Year: 2022).*

* cited by examiner

STABILIZATION OF LASER-BASED SENSORS

CROSS-REFERENCES TO RELATED APPLICATIONS

This application is a non-provisional and claims benefit of U.S. Provisional Application No. 63/512,043 filed Jul. 5, 2023, the specification of which is incorporated herein in its entirety by reference.

FIELD OF THE INVENTION

The present invention is directed to a magnetic sensing system capable of reducing noise from laser source fluctuation, mechanical vibrations, and electrical interference, helping to greatly increase the sensitivity of the sensor.

BACKGROUND OF THE INVENTION

A magnetometer is a device used to measure the magnetic field, particularly with respect to its magnetic strength and orientation. Magnetometers, due to the many ways that magnetic fields appear in the world, are used for a variety of purposes. These include locating objects giving off a magnetic field or that are susceptible to magnetism, especially in hazardous locations, heart monitoring, positioning for drills and military weapons systems, weather prediction, plate tectonics, radio wave propagation, and planetary exploration. Additionally, magnetometers can be used for air transportation navigation, such as in spacecraft, airplanes, helicopters, etc.

To develop a highly sensitive laser-based quantum magnetometer, noise sources must be mitigated to maximize the device's potential. Thus, there exists a present need for a laser system comprising multiple mechanisms for stabilization and noise reduction.

BRIEF SUMMARY OF THE INVENTION

It is an objective of the present invention to provide systems that allow for a magnetometer system capable of reducing noise from laser source fluctuation, mechanical vibrations, and electrical interference, as specified in the independent claims. Embodiments of the invention are given in the dependent claims. Embodiments of the present invention can be freely combined with each other if they are not mutually exclusive.

The present invention features a magnetometer system structured to measure a magnetic field. In some embodiments, the system may comprise a housing comprising an interior wall and one or more shock absorbers disposed along the interior wall, and a laser cavity network disposed within the housing such that the laser cavity network is suspended in place by the one or more shock absorbers. In some embodiments, the laser cavity network may comprise one or more laser cavity arms. In some embodiments, each cavity arm may comprise a gain chip configured to generate a laser beam, and a means for locking a wavelength of the laser beam, configured to tune the laser beam and maintain a single frequency operation for the laser beam. The laser cavity network may further comprise a nitrogen-vacancy (NV) diamond disposed within the laser cavity network, configured to accept the one or more laser beams of the one or more laser cavity arms and measure the magnetic field in response to the plurality of laser beams. Measuring the magnetic field may comprise optically measuring an electron spin state of a center of the NV diamond. In some embodiments, the system may further comprise a supply and control subsystem communicatively connected to the laser cavity network such that the supply and control subsystem is external to the housing. The supply and control subsystem may comprise a power supply configured to power the laser cavity network and control electronics to control a function of the laser cavity network.

For the nitrogen-vacancy (NV) diamond quantum magnetometer, several sources of noise are identified and solutions to minimizing their effect on device performance are described here. It is anticipated these techniques will work for many laser-based sensors. In order to maximize laser performance, the three main sources of noise must be mitigated simultaneously. They are laser output fluctuations, mechanical vibrations, and electronic interference.

One of the unique and inventive technical features of the present invention is the implementation of a separation between the laser pumping source, power source, and control electronics of a magnetometer from the detecting portion into different housings. Without wishing to limit the invention to any theory or mechanism, it is believed that the technical feature of the present invention advantageously provides for a significant decrease in electrical interference in the magnetic field measurement of the magnetometer, resulting in increased efficiency and accuracy of the final measurement. None of the presently known prior references or work has the unique inventive technical feature of the present invention.

Furthermore, the inventive technical feature of the presently claimed invention is counterintuitive. The reason that it is counterintuitive is because it contributed to a surprising result. One skilled in the art would expect decreased efficiency from a system separating the detector component from the power source, laser source, and control electronics. Typically, packaged systems aim to maintain a compact and monolithic design where all components share the same mechanical vibrations. Especially in VECSEL systems, stable operation is more easily obtained when components are placed close together. The present invention is able to achieve greater sensitivity without a decrease in efficiency due to the decrease in electrical interference from keeping certain components separate from the detecting portion of the magnetometer device. Thus, the inventive technical feature of the present invention contributed to a surprising result.

Any feature or combination of features described herein are included within the scope of the present invention provided that the features included in any such combination are not mutually inconsistent as will be apparent from the context, this specification, and the knowledge of one of ordinary skills in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which.

DETAILED DESCRIPTION OF THE INVENTION

The term "etalon" is defined herein as an optical device containing parallel mirrors, used as a narrow band filter, often in laser design.

The term "birefringent filter" is defined herein as an optical filter device that is often used in a laser resonator for tuning of the output wavelength and/or for narrowing the optical bandwidth (linewidth) through the double refraction of light in a transparent, molecularly ordered material, which is manifested by the existence of orientation-dependent differences in refractive index.

The term "tuning filter" is defined herein as an optical filter where certain filter parameters are tunable—either manually or with an electronic control system. Thus, the rough tuning filter of the present invention is configured to alter the wavelength of a laser to be within a broad range of predetermined wavelengths.

The term "VECSEL" is defined herein as a vertical-external-cavity surface-emitting laser device. A VECSEL is a small semiconductor laser, where the laser light propagates perpendicular to the semiconductor wafer surface (surface-emitting).

Figure 1:
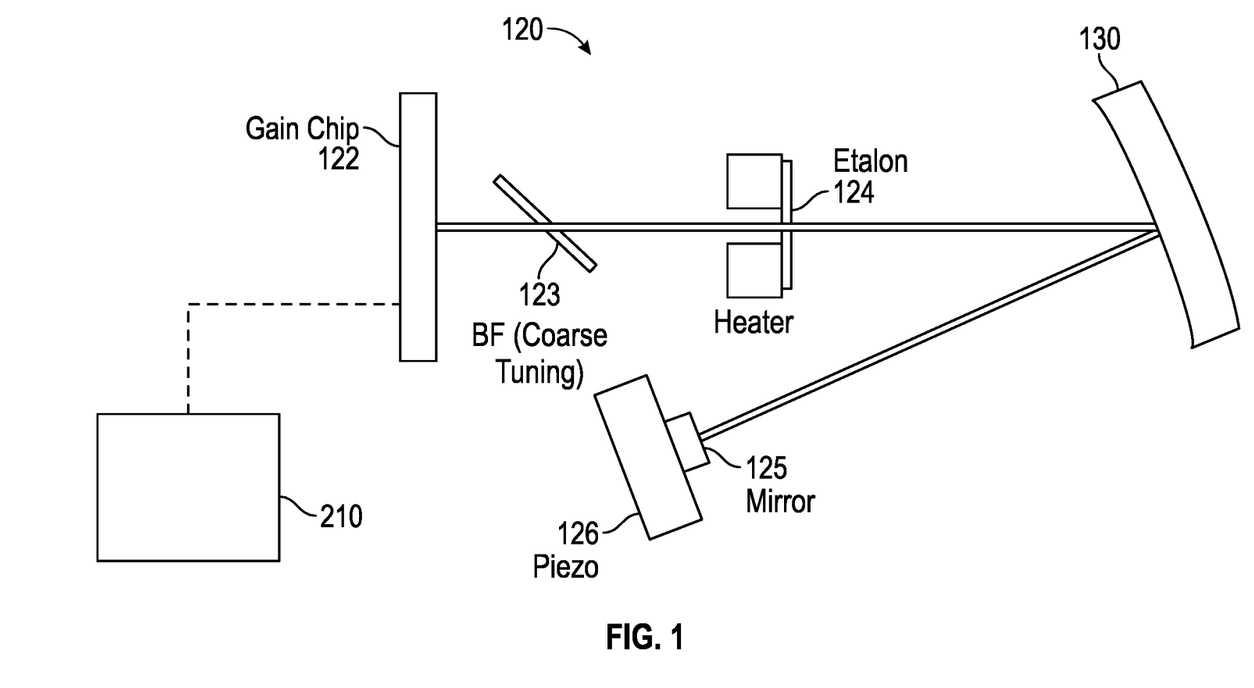
FIG. 1 shows a design for a VECSEL with integrated tuning and laser line stabilization.
Figure 2:
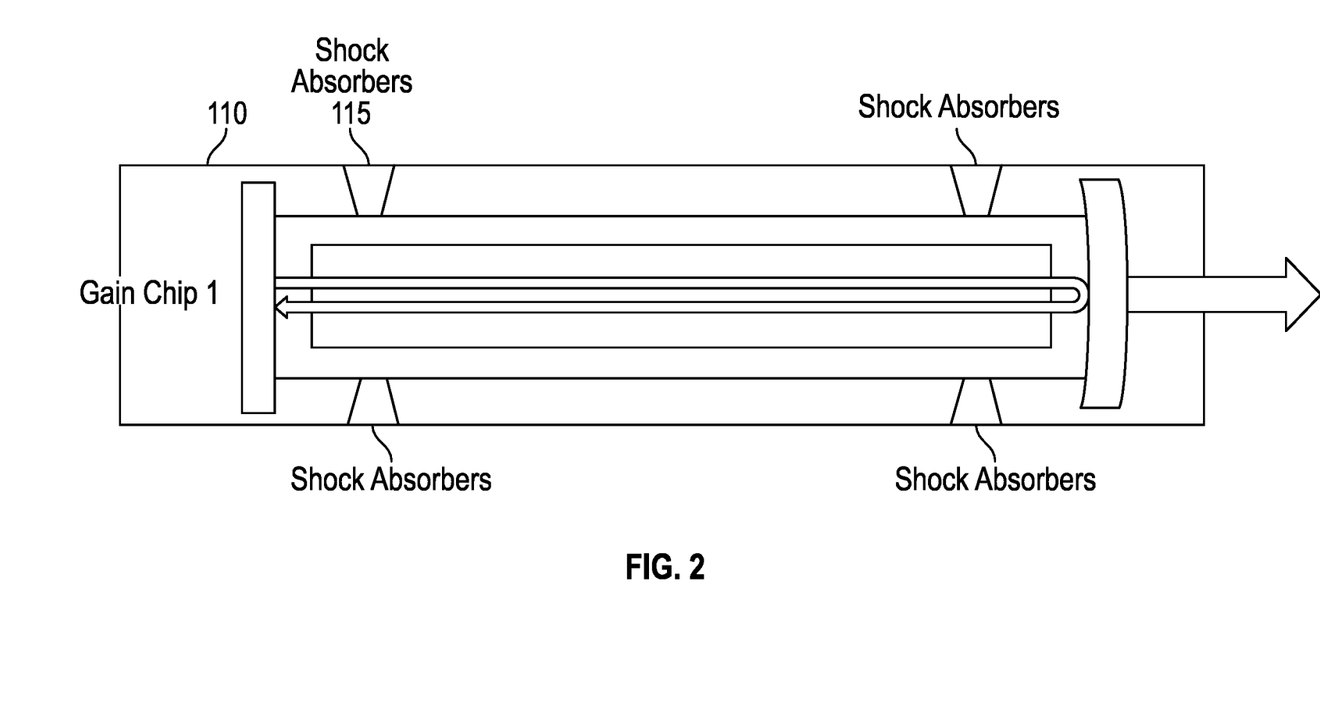
FIG. 2 shows a method for mitigation of mechanical vibration of the sensor "head."
Figure 3:
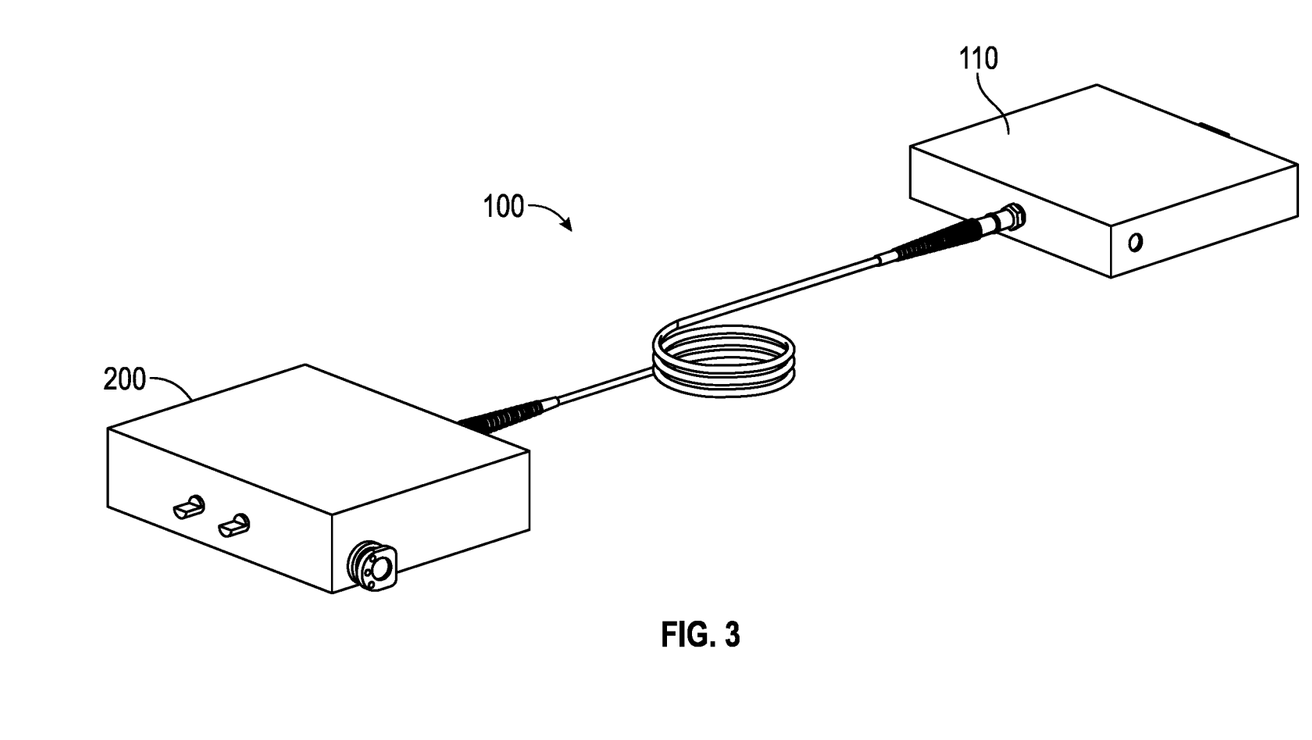
FIG. 3 shows a design for the mitigation of electrical interference in a VECSEL system with the "head" of the device separated from the supply and control components.

Referring now to FIGS. 1-3, the present invention features a magnetometer system (100) structured to measure a magnetic field. In some embodiments, the system (100) may comprise a housing (110) comprising an interior wall and one or more shock absorbers (115) disposed along the interior wall, and a laser cavity network (120) disposed within the housing (110) such that the laser cavity network (120) is suspended in place by the one or more shock absorbers (115). In some embodiments, the laser cavity network (120) may comprise one or more laser cavity arms. In some embodiments, each cavity arm may comprise a gain chip (122) configured to generate a laser beam, and a means for locking a wavelength of the laser beam, configured to tune the laser beam and maintain a single frequency operation for the laser beam. The laser cavity network (120) may further comprise a nitrogen-vacancy (NV) diamond (130) disposed within the laser cavity network (120), configured to accept the one or more laser beams of the one or more laser cavity arms and measure the magnetic field in response to the plurality of laser beams. Measuring the magnetic field may comprise optically measuring an electron spin state of a center of the NV diamond (130). In some embodiments, the system (100) may further comprise a solid state electron detector configured to measure the electron spin state of the center of the NV diamond (130).

The present invention features a magnetometer system (100) structured to measure a magnetic field, the system (100). In some embodiments, the system (100) may comprise a housing (110) and a laser cavity network (120) disposed within the housing (110). In some embodiments, the laser cavity network (120) may comprise one or more laser cavity arms, each cavity arm comprising a cavity and a gain chip (122) configured to generate a laser beam. The laser cavity network (120) may further comprise a nitrogen-vacancy (NV) diamond (130) disposed within the laser cavity network (120), configured to accept the one or more laser beams of the one or more laser cavity arms and measure the magnetic field in response to the plurality of laser beams. Measuring the magnetic field may comprise optically measuring an electron spin state of a center of the NV diamond (130). The system (100) may further comprise a supply and control subsystem (200) operatively coupled to the laser cavity network (120) such that the supply and control subsystem (200) is external to the housing (110), the supply and control subsystem (200) comprising a laser pumping source configured to power each gain chip (122) of the one or more laser cavity arms.

The present invention features a magnetometer system (100) structured to measure a magnetic field. In some embodiments, the system (100) may comprise a housing (110) and a laser cavity network (120) disposed within the housing (110). In some embodiments, the laser cavity network (120) may comprise one or more laser cavity arms, each cavity arm comprising a cavity, a gain chip (122) configured to generate a laser beam within the cavity, and a means for locking a wavelength of the laser beam, configured to tune the laser beam and maintain a single frequency operation for the laser beam. The laser cavity network (120) may comprise a nitrogen-vacancy (NV) diamond (130) disposed at a central point of the laser cavity network (120), configured to accept the one or more laser beams of the one or more laser cavity arms and measure the magnetic field in response to the plurality of laser beams. Measuring the magnetic field may comprise optically measuring an electron spin state of a center of the NV diamond (130). The system (100) may further comprise a supply and control subsystem (200) operatively coupled to the laser cavity network (120) such that the supply and control subsystem (200) is external to the housing (110), the supply and control subsystem (200) comprising a laser pumping source configured to power each gain chip (122) of the one or more laser cavity arms.

The present invention features a magnetometer system (100) structured to measure a magnetic field. In some embodiments, the system (100) may comprise a housing (110) comprising an interior wall and one or more shock absorbers (115) disposed along the interior wall. The system (100) may further comprise a laser cavity network (120) disposed within the housing (110) such that the laser cavity network (120) is suspended in place by the one or more shock absorbers (115). In some embodiments, the laser cavity network (120) may comprise one or more laser cavity arms, each cavity arm comprising a cavity, a gain chip (122) configured to generate a laser beam within the cavity, and a means for locking a wavelength of the laser beam, configured to tune the laser beam and maintain a single frequency operation for the laser beam. The laser cavity network (120) may further comprise a nitrogen-vacancy (NV) diamond (130) disposed at a central point of the laser cavity network (120), configured to accept the one or more laser beams of the one or more laser cavity arms and measure the magnetic field in response to the plurality of laser beams. Measuring the magnetic field may comprise optically measuring an electron spin state of a center of the NV diamond (130). The system (100) may further comprise a supply and control subsystem (200) operatively coupled to the laser cavity network (120) such that the supply and control subsystem (200) is external to the housing (110), the supply and control subsystem (200) comprising a laser pumping source configured to power each gain chip (122) of the one or more laser cavity arms.

In some embodiments, the system (100) may further comprise a supply and control subsystem (200) communicatively connected to the laser cavity network (120) such that the supply and control subsystem (200) is external to the housing (110). The supply and control subsystem (200) may comprise a power supply configured to power the laser cavity network (120) and control electronics to control a function of the laser cavity network (120). In some embodiments, the "head" and the supply and control subsystem may be connected at least partially by a wired connection (e.g. a cable) or partially by a wireless connection through the use of an antenna capable of wireless communication (i.e. a radiofrequency transceiver, a Bluetooth chip, etc.).

In some embodiments, the one or more shock absorbers (115) may comprise springs, foam, rubber, or a combination thereof. In some embodiments, the housing (110) may comprise a plastic, rubber, metallic, or any other rigid material (or material with low thermal expansion coefficients). The one or more shock absorbers (115) may be fabricated into the housing (110) or attached to the interior of the housing by an adhesive, a connecting component, or a combination thereof. In some embodiments, the housing (110) may be sized to hold a plurality of laser cavity networks (e.g., 1 to 5 laser cavity networks). In some embodiments, each laser cavity network may comprise 1 to 10 cavity arms.

In some embodiments, for each laser cavity arm of the one or more laser cavity arms, the means for locking the wavelength of the laser beam may comprise a rough tuning filter (123) operatively coupled to the gain chip (122), configured to coarsely tune the laser beam generated by the gain chip (122). In some embodiments, the rough tuning filter (123) may comprise a birefringent filter.

In some embodiments, for each laser cavity arm of the one or more laser cavity arms, the means for locking the wavelength of the laser beam may further comprise a temperature-controlled etalon (124) disposed optically in line with the gain chip (122), configured to fine-tune and narrow a linewidth of the laser beam. In some embodiments, the temperature-controlled etalon (124) may comprise a thermoelectric cooler or a heater. In some embodiments, the temperature-controlled etalon (124) may be disposed sequentially after the rough tuning filter (123) in relation to the gain chip (122) such that beam produced by the gain chip (122) is first coarsely tuned by the rough tuning filter (123) to be within a broad range of wavelengths, and is then finely tuned by the temperature-controlled etalon (124) to be within a narrower range of wavelengths or a single wavelength.

In some embodiments, each laser cavity arm of the one or more laser cavity arms may further comprise a mirror component (125) disposed optically in line with the gain chip (122). In some embodiments, for each laser cavity arm of the one or more laser cavity arms, the means for locking the wavelength of the laser beam may further comprise a laser line stabilization component (126) operatively coupled to the mirror component (125), configured to adjust a position of the mirror component (125) to lock the wavelength of the laser beam to a desired wavelength. In some embodiments, the mirror may define a length of the corresponding laser cavity arm. In some embodiments, each laser cavity arm of the one or more laser cavity arms may comprise a vertical external surface-emitting laser (VECSEL).

In some embodiments, other properties of the laser beam may be locked in place by other corresponding components, such as the frequency, direction, amplitude, time period, or a combination thereof. In some embodiments, the laser beam may be frequency-locked by a resonator length control component, optical feedback from a stable reference cavity, or a combination thereof. In some embodiments, the time period of the laser beam may be locked based on a comparison of the phases of the laser beam and an electronic reference oscillator, a cavity length control component, or a combination thereof. In some embodiments, the laser beam may be direction-locked by a beam position measurement (e.g. with a four-quadrant photodiode), correction via piezo-controlled resonator mirrors, or a combination thereof.

In some embodiments, the present invention may comprise a computing device disposed in the supply and control subsystem (200) of the present invention, configured to control elements of the system. The computing device may comprise a processor configured to execute computer-readable instructions and a memory component comprising computer-readable instructions. In some embodiments, the instructions may comprise actuating the laser pumping source to transfer energy to the gain chips of the laser cavity arms such that each gain chip generates a laser within its corresponding cavity. The instructions may further include actuating the temperature control components (heater, cooler, etc.) of the temperature-controlled etalon. The instructions may further comprise rotating the rough tuning filter to tune a desired wavelength of the laser directed through said rough tuning filter. The instructions may further comprise actuating the laser line stabilization component to adjust a position of the mirror component (125) to lock the wavelength of the laser beam to a desired wavelength. The instructions may further comprise actuating the solid-state electron detector to measure the electron spin state of the center of the NV diamond (130) to determine the magnetic field measurement. Accordingly, the supply and control subsystem (200) may be communicatively coupled to the laser pumping source, the rough tuning filter, the temperature-controlled etalon, the laser line stabilization component, and the solid state electron detector.

In some embodiments, the laser pumping source may comprise an optical pumping source, such as a diode laser, another VECSEL, another laser source, a flash tube, or an electrical power source configured to deliver light energy to the gain chip. In some embodiments, the laser pumping source may comprise an electric discharge source, such as an electrical discharge tube configured to accelerate electrons to high velocities by a strong electrical field and collide these electrons with a gas to produce a laser. In some embodiments, the laser pumping source may comprise a chemical pumping source, such as a container comprising one or more substances undergoing a chemical reaction such that energy is transferred from the container to the gain chip. In some embodiments, the laser pumping source may comprise a heat pumping source, such as a heater component and a cooling component configured to rapidly heat up and rapidly cool down the gain chip respectively, such that a laser beam is generated within the cavity.

The computer system can include a desktop computer, a workstation computer, a laptop computer, a netbook computer, a tablet, a handheld computer (including a smartphone), a server, a supercomputer, a wearable computer (including a SmartWatch™), or the like and can include digital electronic circuitry, firmware, hardware, memory, a computer storage medium, a computer program, a processor (including a programmed processor), an imaging apparatus, wired/wireless communication components, or the like. The computing system may include a desktop computer with a screen, a tower, and components to connect the two. The tower can store digital images, numerical data, text data, or any other kind of data in binary form, hexadecimal form, octal form, or any other data format in the memory component. The data/images can also be stored in a server communicatively coupled to the computer system. The images can also be divided into a matrix of pixels, known as a bitmap that indicates a color for each pixel along the horizontal axis and the vertical axis. The pixels can include a digital value of one or more bits, defined by the bit depth. Each pixel may comprise three values, each value corresponding to a major color component (red, green, and blue). A size of each pixel in data can range from a 8 bits to 24 bits. The network or a direct connection interconnects the imaging apparatus and the computer system.

The term "processor" encompasses all kinds of apparatus, devices, and machines for processing data, including by way of example a programmable microprocessor, a microcontroller comprising a microprocessor and a memory component, an embedded processor, a digital signal processor, a media processor, a computer, a system on a chip, or multiple ones, or combinations, of the foregoing. The apparatus can include special-purpose logic circuitry, e.g., an FPGA (field programmable gate array) or an ASIC (application-specific integrated circuit). Logic circuitry may comprise multiplexers, registers, arithmetic logic units (ALUs), computer memory, look-up tables, flip-flops (FF), wires, input blocks, output blocks, read-only memory, randomly accessible memory, electronically-erasable programmable read-only memory, flash memory, discrete gate or transistor logic, discrete hardware components, or any combination thereof. The apparatus also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures. The processor may include one or more processors of any type, such as central processing units (CPUs), graphics processing units (GPUs), special-purpose signal or image processors, field-programmable gate arrays (FPGAs), tensor processing units (TPUs), and so forth.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

Embodiments of the subject matter and the operations described herein can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, a data processing apparatus.

A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or can be included in, one or more separate physical components or media (e.g., multiple CDs, drives, or other storage devices). The operations described in this specification can be implemented as operations performed by a data processing apparatus on data stored on one or more computer-readable storage devices or received from other sources.

Program code embodied on a computer-readable medium may be transmitted using any appropriate medium, including but not limited to wireless, wireline, optical fiber cable, R.F, Bluetooth, storage media, computer buses, etc., or any suitable combination of the foregoing. Computer program code for carrying out operations for aspects of the present disclosure may be written in any combination of one or more programming languages, including an object-oriented programming language such as Java, Smalltalk, C #, Ruby, or the like, conventional procedural programming languages, such as Pascal, FORTRAN, BASIC, or similar programming languages, programming languages that have both object-oriented and procedural aspects, such as the "C" programming language, C++, Python, or the like, conventional functional programming languages such as Scheme, Common Lisp, Elixir, or the like, conventional scripting programming languages such as PHP, Perl, Javascript, or the like, or conventional logic programming languages such as PROLOG, ASAP, Datalog, or the like.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks.

However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

Computers typically include known components, such as a processor, an operating system, system memory, memory storage devices, input-output controllers, input-output devices, and display devices. It will also be understood by those of ordinary skill in the relevant art that there are many possible configurations and components of a computer and may also include cache memory, a data backup unit, and many other devices. To provide for interaction with a user, embodiments of the subject matter described in this specification can be implemented on a computer having a display device, e.g., an LCD (liquid crystal display), LED (light emitting diode) display, or OLED (organic light emitting diode) display, for displaying information to the user.

Examples of input devices include a keyboard, cursor control devices (e.g., a mouse or a trackball), a microphone, a scanner, and so forth, wherein the user can provide input to the computer. Other kinds of devices can be used to provide for interaction with a user as well; for example, feedback provided to the user can be in any form of sensory feedback, e.g., visual feedback, auditory feedback, or tactile feedback; and input from the user can be received in any form, including acoustic, speech, or tactile input. Examples of output devices include a display device (e.g., a monitor or projector), speakers, a printer, a network card, and so forth. Display devices may include display devices that provide visual information, this information typically may be logically and/or physically organized as an array of pixels. In addition, a computer can interact with a user by sending documents to and receiving documents from a device that is used by the user; for example, by sending web pages to a web browser on a user's client device in response to requests received from the web browser.

An interface controller may also be included that may comprise any of a variety of known or future software programs for providing input and output interfaces. For example, interfaces may include what are generally referred to as "Graphical User Interfaces" (often referred to as GUI's) that provide one or more graphical representations to a user. Interfaces are typically enabled to accept user inputs using means of selection or input known to those of ordinary skill in the related art. In some implementations, the interface may be a touch screen that can be used to display information and receive input from a user. In the same or alternative embodiments, applications on a computer may employ an interface that includes what are referred to as "command line interfaces" (often referred to as CLI's). CLI's typically provide a text based interaction between an application and a user. Typically, command line interfaces present output and receive input as lines of text through display devices. For example, some implementations may include what are referred to as a "shell" such as Unix Shells known to those of ordinary skill in the related art, or Microsoft® Windows Powershell that employs object-oriented type programming architectures such as the Microsoft® .NET framework.

Those of ordinary skill in the related art will appreciate that interfaces may include one or more GUI's, CLI's or a combination thereof. A processor may include a commercially available processor such as a Celeron, Core, or Pentium processor made by Intel Corporation®, a SPARC processor made by Sun Microsystems®, an Athlon, Sempron, Phenom, or Opteron processor made by AMD Corporation®, or it may be one of other processors that are or will become available. Some embodiments of a processor may include what is referred to as multi-core processor and/or be enabled to employ parallel processing technology in a single or multi-core configuration. For example, a multi-core architecture typically comprises two or more processor "execution cores". In the present example, each execution core may perform as an independent processor that enables parallel execution of multiple threads. In addition, those of ordinary skill in the related field will appreciate that a processor may be configured in what is generally referred to as 32 or 64 bit architectures, or other architectural configurations now known or that may be developed in the future.

A processor typically executes an operating system, which may be, for example, a Windows type operating system from the Microsoft® Corporation; the Mac OS X operating system from Apple Computer Corp.®; a Unix® or Linux®-type operating system available from many vendors or what is referred to as an open source; another or a future operating system; or some combination thereof. An operating system interfaces with firmware and hardware in a well-known manner, and facilitates the processor in coordinating and executing the functions of various computer programs that may be written in a variety of programming languages. An operating system, typically in cooperation with a processor, coordinates and executes functions of the other components of a computer. An operating system also provides scheduling, input-output control, file and data management, memory management, and communication control and related services, all in accordance with known techniques.

Connecting components may be properly termed as computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only, and the claims are not limited by the dimensions of the figures. In some embodiments, descriptions of the inventions described herein using the phrase "comprising" includes embodiments that could be described as "consisting essentially of" or "consisting of," and as such, the written description requirement for claiming one or more embodiments of the present invention using the phrase "consisting essentially of" or "consisting of" is met.

The reference numbers recited in the below claims are solely for ease of examination of this patent application, are exemplary, and are not intended in any way to limit the scope of the claims to the particular features having the corresponding reference numbers in the drawings.

What is claimed is:

1. A magnetometer system (100) structured to measure a magnetic field, the system (100) comprising:
 a. a housing (110);
 b. a laser cavity network (120) disposed within the housing (110), the laser cavity network (120) comprising:
  i. one or more laser cavity arms, each cavity arm comprising:
   A. a cavity;
   B. a gain chip (122) configured to generate a laser beam; and
   C. a rough tuning filter (123) comprising a birefringent filter operatively coupled to the gain chip (122), configured to coarsely tune the laser beam generated by the gain chip (122) to be within a broad range of wavelengths and maintain a single frequency operation for the laser beam; and
  ii. a nitrogen-vacancy (NV) diamond (130) disposed within the laser cavity network (120), configured to accept the one or more laser beams of the one or more laser cavity arms and measure the magnetic field in response to the plurality of laser beams;
   wherein measuring the magnetic field comprises optically measuring an electron spin state of a center of the NV diamond (130); and
 c. a supply and control subsystem (200) operatively coupled to the laser cavity network (120) such that the supply and control subsystem (200) is external to the housing (110), the supply and control subsystem (200) comprising a laser pumping source (210) configured to power each gain chip (122) of the one or more laser cavity arms.

2. A magnetometer system (100) structured to measure a magnetic field, the system (100) comprising:
 a. a housing (110);
 b. a laser cavity network (120) disposed within the housing (110), the laser cavity network (120) comprising:
  i. one or more laser cavity arms, each cavity arm comprising:
   A. a cavity;
   B. a gain chip (122) configured to generate a laser beam; and
   C. a temperature-controlled etalon (124) comprising a thermoelectric cooler disposed optically in line with the gain chip (122), configured to fine-tune and narrow a linewidth of the laser beam; and
  ii. a nitrogen-vacancy (NV) diamond (130) disposed within the laser cavity network (120), configured to accept the one or more laser beams of the one or more laser cavity arms and measure the magnetic field in response to the plurality of laser beams;
   wherein measuring the magnetic field comprises optically measuring an electron spin state of a center of the NV diamond (130); and
 c. a supply and control subsystem (200) operatively coupled to the laser cavity network (120) such that the supply and control subsystem (200) is external to the housing (110), the supply and control subsystem (200) comprising a laser pumping source (210) configured to power each gain chip (122) of the one or more laser cavity arms.

3. A magnetometer system (100) structured to measure a magnetic field, the system (100) comprising:
 a. a housing (110);
 b. a laser cavity network (120) disposed within the housing (110), the laser cavity network (120) comprising:
  i. one or more laser cavity arms each cavity arm comprising a cavity and a gain chin (122) configured to generate a laser beam; and
  ii. a nitrogen-vacancy (NV) diamond (130) disposed within the laser cavity network (120), configured to accept the one or more laser beams of the one or more laser cavity arms and measure the magnetic field in response to the plurality of laser beams;
   wherein measuring the magnetic field comprises optically measuring an electron spin state of a center of the NV diamond (130); and
 c. a supply and control subsystem (200) operatively coupled to the laser cavity network (120) such that the supply and control subsystem (200) is external to the housing (110), the supply and control subsystem (200) comprising a laser pumping source (210) configured to power each gain chip (122) of the one or more laser cavity arms;
  wherein each laser cavity arm of the one or more laser cavity arms comprises a vertical external surface-emitting laser (VECSEL).

* * * * *